(12) United States Patent
Yi

(10) Patent No.: US 8,867,257 B2
(45) Date of Patent: Oct. 21, 2014

(54) VARIABLE RESISTANCE MEMORY DEVICE

(75) Inventor: Jae-Yun Yi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 235 days.

(21) Appl. No.: 13/596,929

(22) Filed: Aug. 28, 2012

(65) Prior Publication Data

US 2013/0170282 A1 Jul. 4, 2013

(30) Foreign Application Priority Data

Dec. 29, 2011 (KR) .................. 10-2011-0146256

(51) Int. Cl.
*G11C 11/00* (2006.01)
(52) U.S. Cl.
USPC .................. 365/148; 365/185.05; 365/63
(58) Field of Classification Search
CPC ............... G11C 13/0069; G11C 2013/0073; G11C 13/0002
USPC ........................ 365/148, 185.05, 63
See application file for complete search history.

(56) References Cited

U.S. PATENT DOCUMENTS

| 2013/0077384 A1* | 3/2013 | Azuma et al. ................ 365/148 |
| 2013/0314975 A1* | 11/2013 | Katayama et al. ............ 365/148 |
| 2014/0098594 A1* | 4/2014 | Azuma et al. ................ 365/148 |

OTHER PUBLICATIONS

Eike Linn, et al., "Complementary resistive switches for passive nanocrossbar memories," Nature Materials, May 2010, pp. 403-406, vol. 9.

* cited by examiner

*Primary Examiner* — Tuan T Nguyen
(74) *Attorney, Agent, or Firm* — IP & T Group LLP

(57) ABSTRACT

A variable resistance memory device includes: first and second structures that each include a first electrode, a second electrode, and a variable resistance material layer interposed between the first and second electrodes and configured to switch between different resistance states depending on a voltage applied across the variable resistance material layer; and a material layer interposed between the first and second structures and configured to pass a bidirectional current according to a voltage applied across the material layer. The first and second structures are symmetrical with respect to the material layer.

14 Claims, 11 Drawing Sheets

VARIABLE RESISTANCE MEMORY DEVICE

CROSS-REFERENCE TO RELATED APPLICATIONS

The present application claims priority of Korean Patent Application No. 10-2011-0146256, filed on Dec. 29, 2011, which is incorporated herein by reference in its entirety.

BACKGROUND

1. Field

Exemplary embodiments of the present invention relate to a variable resistance memory device, and more particularly, to a variable resistance memory device having a complementary resistive switch (CRS) structure.

2. Description of the Related Art

Recently, a variety of variable resistance memory devices have been developed, which store data using a material having different resistance states depending on an applied bias voltage. In general, a unit cell of a variable resistance memory device includes a variable resistance material layer interposed between two electrodes for voltage application.

Such a variable resistance memory device may be divided into two types depending on switching characteristics. More specifically, a variable resistance memory device may be switched to a unipolar mode in which set/reset operations are performed using one polarity or a bipolar mode in which set/reset operations are performed using different voltage polarities. The variable resistance memory device in the bipolar mode exhibits uniform switching characteristics and performs a reset operation through an electric field. Here, the variable resistance memory device has a small reset current.

Meanwhile, in order to increase the integration degree of the variable resistance memory device, a so-called cross-point structure has been developed. A cross-point structure includes a plurality of first conductive lines parallel to each other, a plurality of second conductive lines parallel to each other in a direction perpendicular to the first conductive lines, and a plurality of unit cells arranged at the respective intersections between the first conductive lines and the second conductive lines.

In such a cross-point structure, however, since variable resistance material layers are substantially coupled to each other through the first and second conductive lines, leakage current may occur in an unselected cell such as a cell in a low-resistance state.

In order to address the leakage current issues, a variable resistance memory device having a so-called complimentary resistive switch (CRS) structure has been proposed. An exemplary variable resistance memory device has been disclosed in "Complementary resistive switches for passive nanocrossbar memories" (hereinafter, referred to as "Prior Document 1") published in Nature Materials Volume: 9, pp. 403-406, May 2010.

Referring to Prior Document 1, two structures, each of which has the same structure as a conventional unit cell including a first electrode, a second electrode, and a variable resistance material layer interposed therebetween and operates in a bipolar mode, are stacked symmetrically with each other and are used as a unit cell of the CRS structure. That is, when any one structure in the unit cell of the CRS structure includes the first electrode, the variable resistance material layer, and the second electrode which are sequentially stacked, the other structure includes the second electrode, the variable resistance material layer, and the first electrode which are sequentially stacked. Accordingly, when any one structure is set at the same voltage, the other structure is reset.

In the unit cell of the CRS structure, when a first structure is in a high resistance state (HRS) and a second structure is in a low resistance state (LRS), data '0' is stored, and when the first structure is in the LSR and the second structure is in the HRS, data '1' is stored. Therefore, the unit cell stays in a resistance state over the HRS, regardless of the data stored therein. Therefore, although a variable resistance memory device is implemented with the cross-point structure, a leakage current into an unselected cell does not occur, and the power consumption is reduced.

However, since the absolute values of a set voltage Vset and a reset voltage Vreset in the respective structures of the unit cell are substantially equal to each other, the following problems occur during the operation in the cross-point structure.

In order to write data '0' or '1' into a selected cell, a write voltage larger than 2×Vreset or smaller than −2×Vreset should be applied across the selected cell. At this time, when the write voltage is applied to the selected cell, a voltage corresponding to ½ of the write voltage is applied to an unselected cell sharing a conductive line coupled to the selected cell in a cross-point structure. Since the voltage corresponding to ½ of the write voltage corresponds to a read voltage, a read operation of the unselected cell is performed.

In the CRS structure, when the read voltage is applied, the two structures included in the unit cell are changed to the LRS. In other words, during the read operation, the structure in the LRS in the unit cell storing data '0' or '1' maintains the state thereof, but the structure in the HRS is changed to the LRS. As a result, read-out is performed undesirably and changes the data stored in the unit cell. Therefore, during the write operation of the selected cell, the data stored in the unselected cell may be changed.

SUMMARY

An embodiment of the present invention is directed to a variable resistance memory device which is capable of increasing an integration degree because it may be implemented with a cross-point structure, reducing leakage current and power consumption, and improving a write operation characteristic.

In accordance with an embodiment of the present invention, a variable resistance memory device includes: first and second structures that each include a first electrode, a second electrode, and a variable resistance material layer interposed between the first and second electrodes and configured to switch between different resistance states depending on a voltage applied across the variable resistance material layer; and a material layer interposed between the first and second structures and configured to pass a bidirectional current according to a voltage applied across the material layer. The first and second structures are symmetrical with respect to the material layer.

In accordance with another embodiment of the present invention, a variable resistance memory device includes: a plurality of first conductive lines; a plurality of second conductive lines crossing the first conductive lines; and a plurality of cells arranged at intersections between the first conductive lines and the second conductive lines. Each of the cells includes: a material layer configured to pass a bidirectional current according to a voltage applied across the material layer; and first and second structures that each comprise a first electrode and a variable resistance material layer, wherein the first and second structures are formed symmetrically with respect to the material layer.

DETAILED DESCRIPTION

Figure 1:
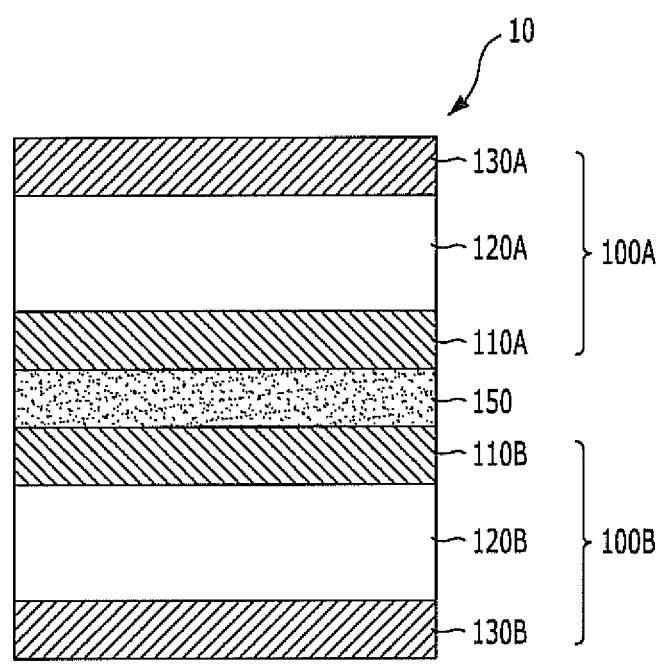
FIG. 1 is a cross-sectional view of a unit cell 10 of a variable resistance memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2A:
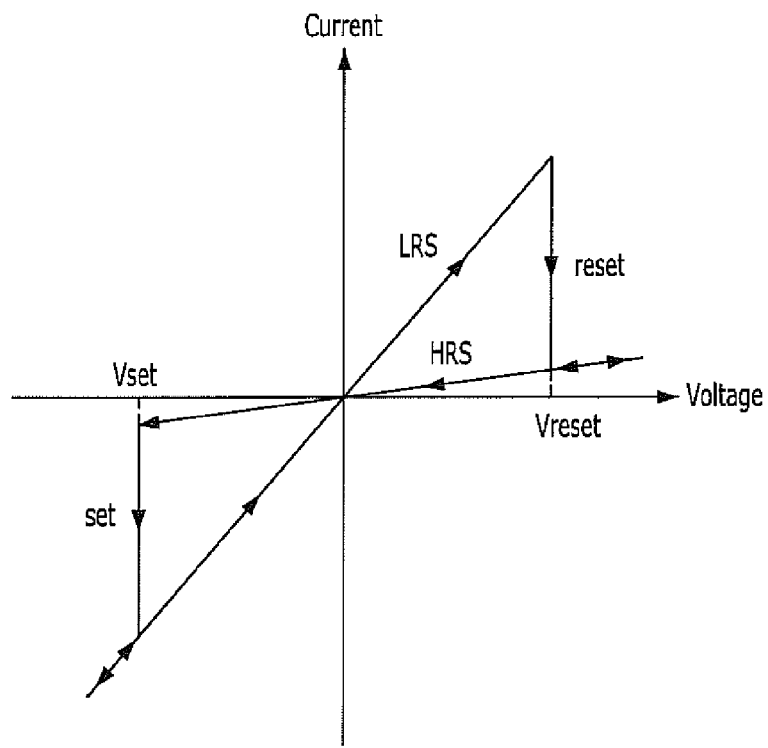
FIGS. 2A to 2C are graphs illustrating characteristics of a first structure 100A, a second structure 100B, and a material layer 150, respectively, which form the unit cell 10 of FIG. 1.
Figure 2B:
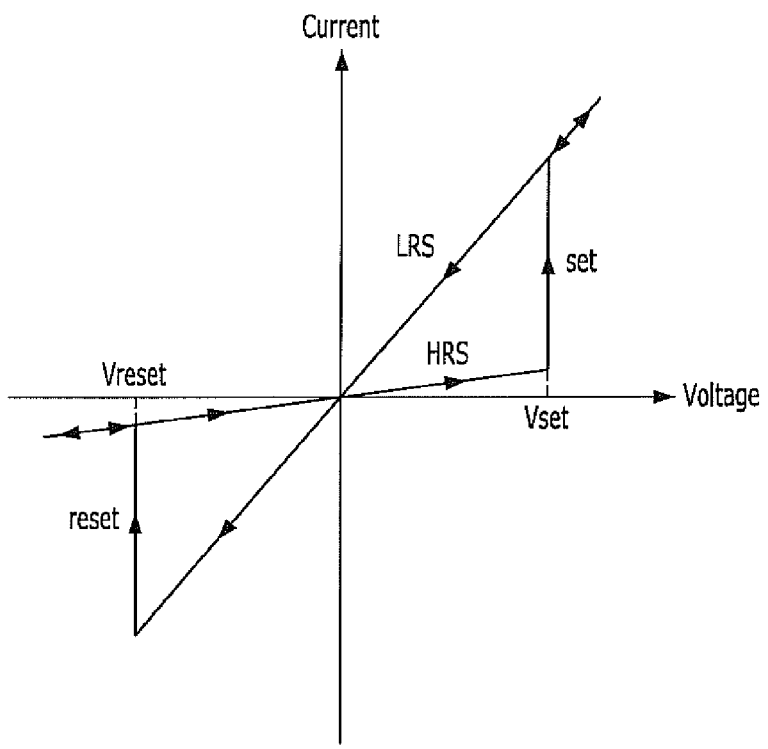
Figure 2C:
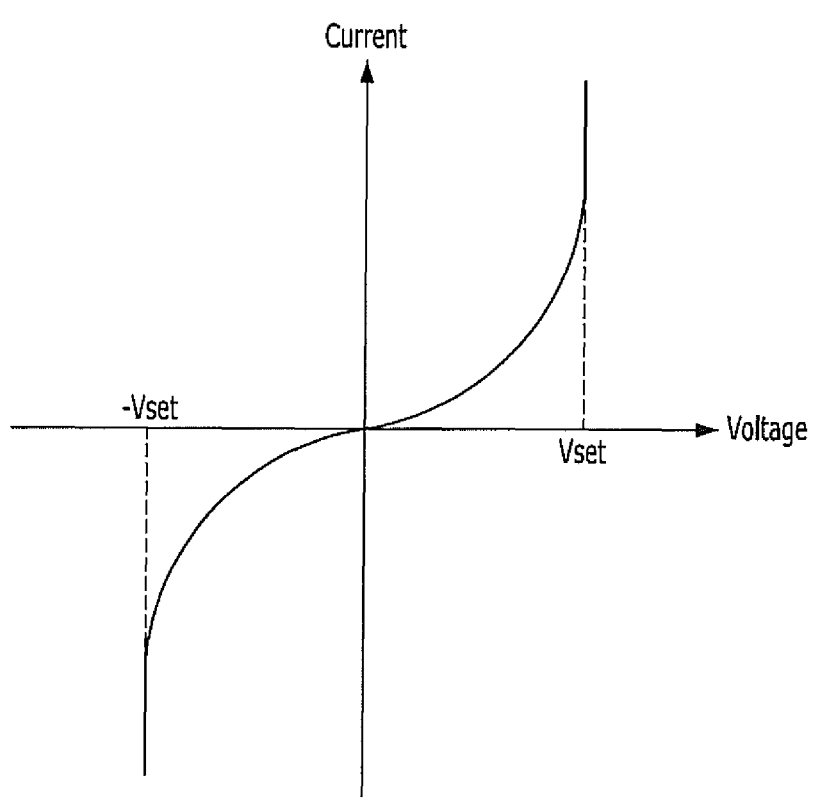
Figure 3A:
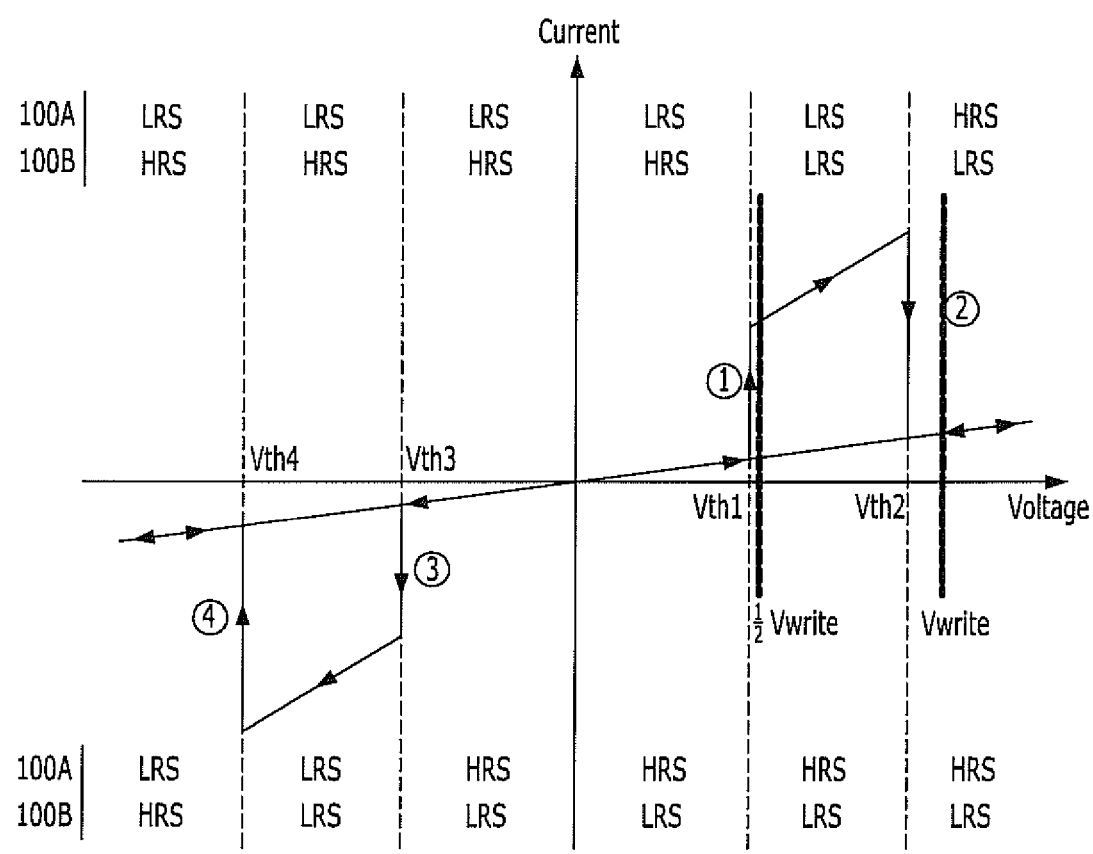
FIG. 3A is a graph illustrating characteristics of the conventional unit cell, in order for comparison with FIG. 3B.
Figure 3B:
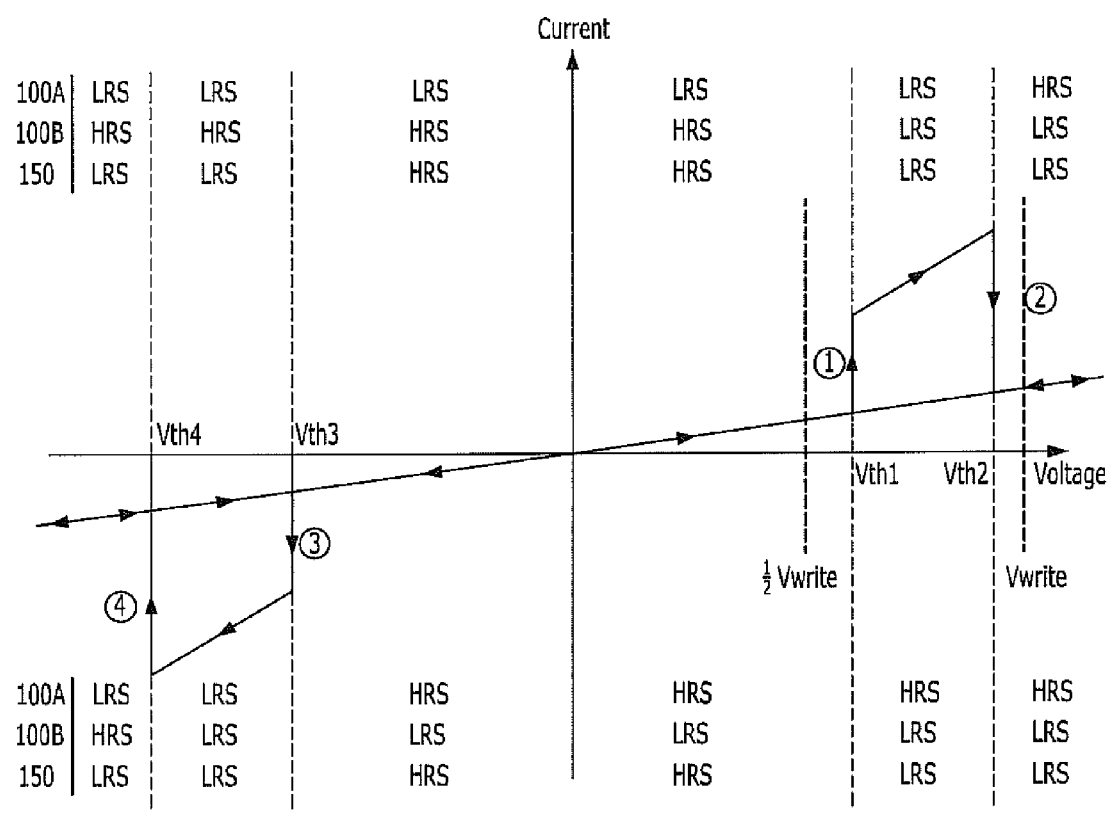
FIG. 3B is a graph illustrating overall characteristics of the unit cell 10 of FIG. 1.

FIG. 1 is a cross-sectional view of a unit cell 10 of a variable resistance memory device in accordance with an embodiment of the present invention. FIGS. 2A to 2C are graphs illustrating characteristics of a first structure 100A, a second structure 100B, and a material layer 150, respectively, which form the unit cell 10 of FIG. 1. FIG. 3B is a graph illustrating overall characteristics of the unit cell 10 of FIG. 1. FIG. 3A is a graph illustrating characteristics of the conventional unit cell, in order for comparison with FIG. 3B.

Referring to FIG. 1, the unit cell 10 of the variable resistance memory device in accordance with the embodiment of the present invention includes a first structure 100A, a second structure 100B, and a material layer 150. The first structure 100A includes a first electrode 110A, a second electrode 130A, and a variable resistance material layer 120A interposed therebetween. The second structure 100B includes a first electrode 110B, a second electrode 130B, and a variable resistance material layer 120B interposed therebetween like the first structure 100A. The material layer 150 is interposed between the first and second structures 100A and 100B and passes a bidirectional current according to a voltage applied across the material layer 150.

Here, the first structure 100A and the second structure 100B are symmetrical with each other with respect to the material layer 150 interposed therebetween. In other words, the components 110A, 120A, and 130A forming the first structure 100A and the components 110B, 120B, and 130B forming the second structure 100B are symmetrical with respect to the material layer 150, and each set of the symmetrical components is formed of the same material.

Specifically, the first electrode 110A of the first structure 100A and the first electrode 110B of the second structure 100B may be formed of the same conductive material. Furthermore, the second electrode 130A of the first structure 100A and the second electrode 130B of the second structure 100B may be formed of the same conductive material. Here, the conductive material may include a metals such as platinum (Pt), tungsten (W), aluminum (Al), copper (Cu), or tantalum (Ta) or metal nitride such as titanium nitride (TiN) or tantalum nitride (TaN). The variable resistance material layers 120A and 120B may include a single layer or multi-layer formed of a material switching between different resistance states according to a voltage applied across the material. According to an example, the material includes an oxide of a transition metal, such as Ta, Ni, Ti, Fe, Co, Mn, or W, a perovskite-based material, a solid electrolyte such as GeSe.

According to this embodiment of the present invention, each of the first and second structures 100A and 100B may serve as a device switching to the bipolar mode. In other words, the polarity of a voltage during a set operation in which the resistance state of the variable material layers 120A and 120B changes from the HRS to the LRS (hereinafter, referred to as a set voltage Vset) may differ from the polarity of a voltage during a reset operation in which the resistance state changes from the LRS to the HRS (hereinafter, referred to as a reset voltage Vreset). Furthermore, the absolute values of the set voltage Vset and the reset voltage Vreset may be substantially equal to each other.

Figure 5A:
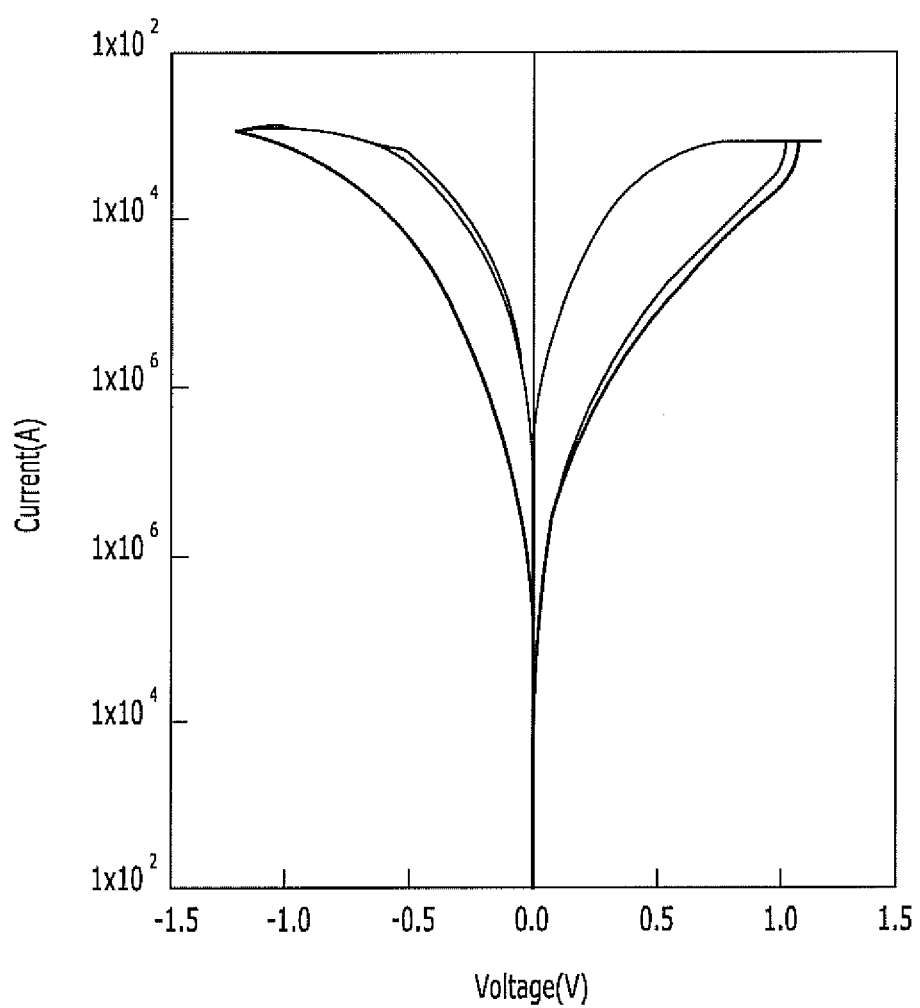
FIG. 5A is a graph showing a current-voltage characteristic of a stacked structure of TiN/Ti/TiO$_2$/TiN.
Figure 5B:
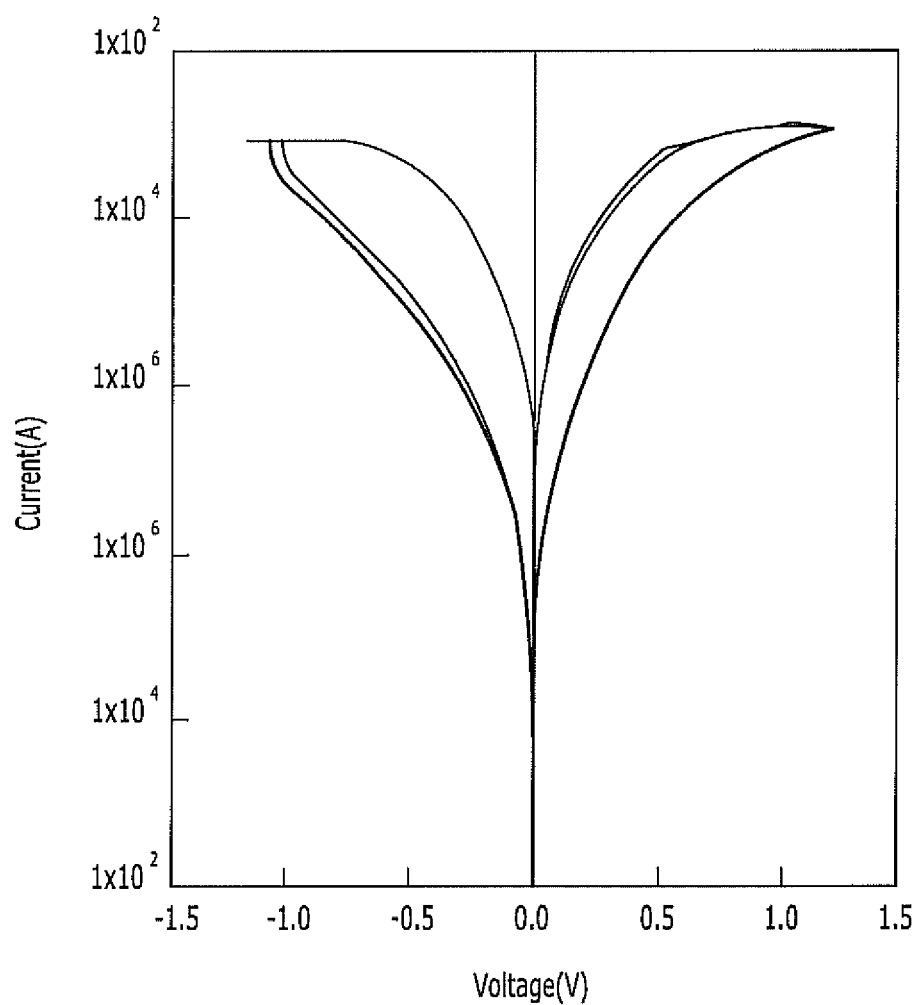
FIG. 5B is a graph showing a current-voltage characteristic of a stacked structure of TiN/TiO$_2$/Ti/TiN.

The first and second structures 100A and 100B switching to the bipolar mode may be implemented in various manners. For example, as in Prior Document 1, Cu may be used as the first electrodes 110A and 110B, a solid electrolyte may be used as the variable resistance material layers 120A and 120B, and Pt may be used as the second electrodes 130A and 130B. According to another example, TiN may be used as the first electrodes 110A and 110B and the second electrodes 130A and 130B, and a stacked layer of TiO$_2$ and Ti may be used as the variable resistance material layers 120A and 120B. Here, in the variable resistance material layer 120A of the first structure 100A, TiO$_2$ is used as a bottom layer and Ti is used as a top layer of the variable resistance material layer 120A. In the variable resistance material layer 120B of the second structure 100B, TiO$_2$ is used as a top layer and Ti is used as a bottom layer of the variable resistance material layer 120B. That is because the first and second structures 100A and 100B are symmetrical with each other as described above. Referring to FIGS. 5A and 5B, it was experimentally confirmed that each of the first and second structures 100A and 100B may operate in the bipolar mode. FIG. 5A is a graph showing a current-voltage characteristic of a stacked structure of TiN/Ti/TiO$_2$/TiN, and FIG. 5B is a graph showing a current-voltage characteristic of a stacked structure of TiN/TiO$_2$/Ti/TiN.

The material layer 150 is formed of a material through which a bidirectional current is passed according to a voltage applied across the material layer. Specifically, when a positive voltage is applied across the material layer 150, a current passes in one direction through the material layer 150, and when a negative voltage is applied, a current passes in the opposite direction of the one direction through the material layer 150. When the magnitudes of the positive voltage and the negative voltage are equal to each other, the magnitudes of the currents passed through the material layer 150 are substantially equal to each other. At this time, as the absolute value of the voltage applied across the material layer 150 increases, the amount of current passed through the material layer 150 increases. According to an example, the amount of current may increase slowly in the range between 0V to a designated voltage, and more rapidly increase after the voltage exceeds the designated voltage.

Figure 5C:
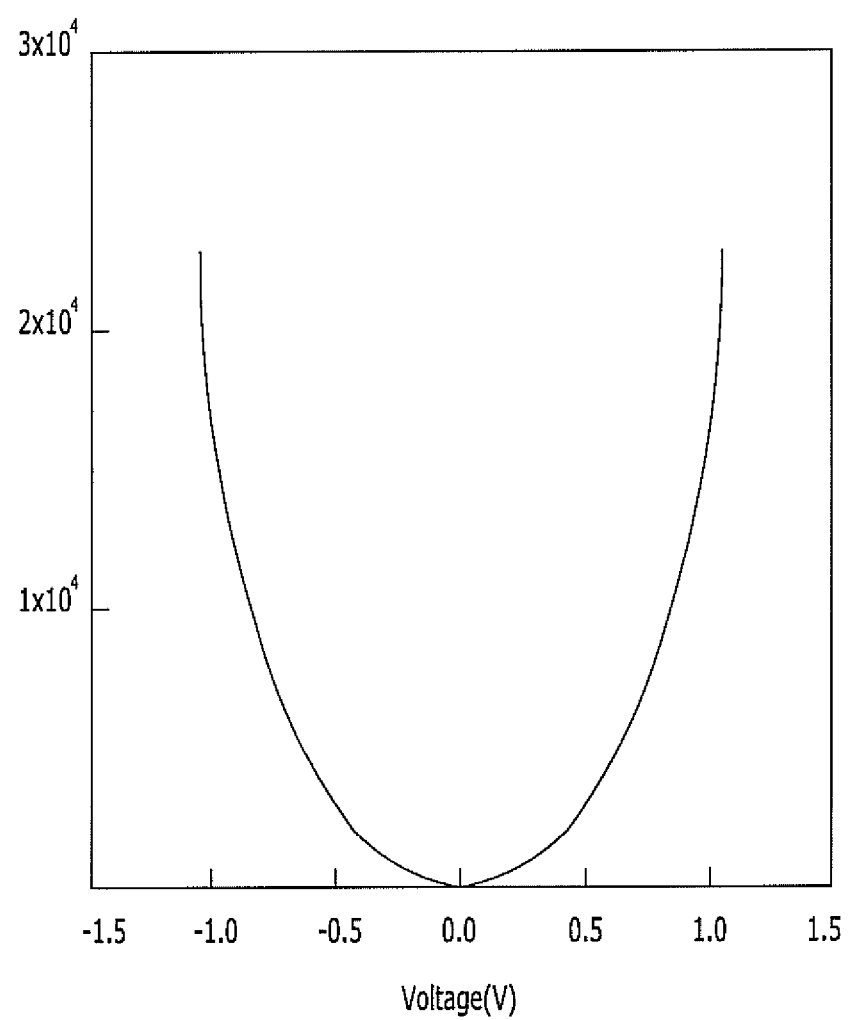
FIG. 5C is a graph showing a current-voltage characteristic of a structure having a TiO$_2$ layer interposed between two TiN electrodes.

Here, the material layer 150 exhibiting such characteristics may be implemented in various manners. For example, the material layer 150 may be formed of amorphous carbon. Alternatively, the material layer 150 may be formed of a transition metal oxide such as $TiO_2$, HfOx, ZrOx, or TaO or nitride such as SiNx. Referring to FIG. 5C, the material layer 150 may be formed of $TiO_2$. FIG. 5C is a graph showing a current-voltage characteristic of a structure having a $TiO_2$ layer interposed between two TIN electrodes.

Hereinafter, referring to FIGS. 2A to 2C, the characteristics of the first structure 100A, the second structure 100B, and the material layer 150 interposed therebetween will be described in more detail.

Referring to FIG. 2A, when a negative voltage applied between the first and second electrodes 110A and 130A of the first structure 100A is gradually increased from 0 in magnitude, a set operation to change the resistance state of the variable resistance material layer 120A from the HRS to the LRS is performed at a certain negative voltage, which is referred to as the set voltage Vset.

Subsequently, when the voltage applied between the first and second electrodes 110A and 130A of the first structure 100A is increased in the positive direction, a reset operation to change the resistance state of the variable resistance material layer 220 from the LRS to the HRS is performed at a certain positive voltage, which is referred to as the reset voltage Vreset.

According to the above-described operations, the first structure 100A is switched to the LRS or the HRS at the set voltage Vset and the reset voltage Vreset and maintains the last resistance state when a voltage across the first structure 100A stays between the set voltage Vset and the reset voltage Vreset. The absolute values of the set voltage Vset and the reset voltage Vreset may be substantially equal to each other.

Referring to FIG. 2B, the operation of the second structure 100B is performed in the opposite manner of the first structure 100A. That is, at the set voltage Vset of the first structure 100A, the second structure 100B is reset, and at the reset voltage Vreset of the first structure 100A, the second structure 100B is reset. Accordingly, the set voltage Vset of the first structure 100A is equal to the reset voltage Vreset of the second structure 100B, and the reset voltage Vreset of the first structure 100A is equal to the set voltage Vset of the second structure 100B.

Referring to FIG. 2C, the material layer 150 passes a bidirectional current according to a voltage applied between the upper first electrode 110A and the lower first electrode 110B. At this time, when the voltage applied between the upper first electrode 110A and the lower first electrode 110B is gradually increased from 0V in the positive direction, a positive current passing through the material layer 150 gradually increases and when the voltage gradually decreases from 0V in the negative direction, a negative current passing through the material layer 150 gradually increases. According to an example, when the absolute values of the voltages are equal to each other, the magnitudes of the current passed in one direction and the current passed in the opposite direction may be substantially equal to each other. Furthermore, when the voltage applied between the first electrode 110A and the first electrode 110B ranges from 0V to ±set voltage Vset of the first or second structure 100A or 100B, the magnitude of the current gradually increases. In the range of ±set voltage Vset or more, however, the magnitude of the current rapidly increases. Accordingly, when the voltage applied between the first electrode 110A and the first electrode 110B ranges from 0V to ±set voltage Vset, the material layer 150 may be defined to be in the HRS, and when the voltage is equal to or more than ±set voltage Vset, the material layer 150 may be defined to be in the LRS. The current flow of the material layer 150 may be controlled to a desired level by controlling the thickness or type of the material layer 150 or properly controlling the oxidation level of the material layer 150 when the material layer 150 is formed of transition metal oxide.

Hereinafter, before the overall characteristics of the unit cell 10 of FIG. 1 are described, the characteristics of a conventional unit cell will be first described with reference to FIG. 3A and Table 1 shown below for enabling a comparison with the unit cell 10 in accordance with the embodiment of the present invention. The conventional unit cell has a structure in which the material layer 150 is omitted from the unit cell 10 of FIG. 1 and the first electrode 110A of the first structure 100A and the first electrode 110B of the second structure 100B are integrated.

TABLE 1

| State of unit cell | Resistance state of first structure 100A | Resistance state of second structure 100B | Resistance state of unit cell |
|---|---|---|---|
| '0' | HRS | LRS | HRS or more |
| '1' | LRS | HRS | HRS or more |
| 'ON' | LRS | LRS | LRS + LRS |

Referring to Table 1, when the first structure 100A is in the HRS and the second structure 100B is in the LRS, data '0' is stored in the unit cell, and when the first structure 100A is in the LRS and the second structure 100B is in the HRS, data '1' is stored in the unit cell. When both of the first and second structures 100A and 100B are in the LRS, the unit cell is in an 'ON' state, where this event occurs, for example, only during a read operation.

Referring to FIG. 3A, when data '1' is stored in the unit cell, that is, when the first structure 100A is in the LRS and the second structure 100B is in the HRS, the unit cell maintains the corresponding state during the time that a voltage applied across the unit cell is increased from 0V in the positive direction, and the second structure 100B is switched from the HRS to the LRS at a timing point that the voltage applied across the unit cell becomes a first voltage Vth1. At this time, the LRS of the first structure 100A is maintained. Accordingly, both of the first and second structures 100A and 100B have the LRS, and the unit cell is in the 'ON' state. At this time, in a state where data '1' is stored in the unit cell, almost every voltage is applied to the second structure 100B in the HRS. Therefore, the first voltage Vth1 may be substantially equal to or slightly larger than the magnitude of the set voltage Vset.

Subsequently, when the voltage across the unit cell is increased from the first voltage Vth1 in the positive direction and reaches a second voltage Vth2, the first structure 100A is switched from the LRS to the HRS, and the unit cell is in the state in which data '0' is stored therein. At this time, the second voltage Vth2 is substantially twice the magnitude of the |reset voltage Vreset. This is because both of the first and second structures 100A and 100B are in the LRS.

Subsequently, when the voltage applied across the unit cell is gradually reduced from the second voltage Vth2, the first structure 100A is switched from the HRS to the LRS at a point where the voltage applied across the unit cell becomes a third voltage Vth3, while the unit cell maintains the corresponding state, and the unit cell is in the 'ON' state. At this time, the third voltage Vth3 may be substantially equal to or slightly smaller than −|set voltage Vset|. This is because almost every voltage qualifies for the first structure 100A being in the HRS when data '0' is stored in the unit cell.

Subsequently, when the voltage applied across the unit cell is reduced from the third voltage Vth3 and reaches a fourth voltage Vth4, the second structure 100B is switched from the LRS to the HRS, and the unit cell is at a state where data '1' is stored therein. At this time, the fourth voltage Vth4 is substantially equal to the double of −|reset voltage Vreset|. This is because both of the first and second structures 100A and 100B are in the LRS. Subsequently, the state of the unit cell is maintained until the voltage is increased from the fourth voltage Vth4 in the positive direction and reaches the first voltage Vth1.

As such, the conventional unit cell is switched to the ON state at the first voltage Vth1, switched to '0' state at the second voltage Vth2, switched to the ON state at the third voltage Vth3, and switched to '1' state at the fourth voltage Vth4. Furthermore, the conventional unit cell maintains the last state in an interval between the respective voltages.

In order to store data '0' in the unit cell, a write voltage larger than the second voltage Vth2 by a designated voltage is applied. Furthermore, in order to store data '1' in the unit cell, a write voltage smaller than the fourth voltage Vth4 by a designated voltage is applied. Furthermore, in order to read the stored data, a read voltage between the first and second voltages Vth1 and Vth2 or between the third and fourth voltages Vth3 and Vth4 is applied. According to an example, when a current is detected during the application of the read voltage between the first and second voltages Vth1 and Vth2, the unit cell is determined to store data '1', and when a current is not detected, the unit cell is determined to store data '0'. Since both of the first and second structures 100A and 100B of the unit cell are switched to the LRS during the read operation, the existing data storage state is destroyed.

However, a voltage corresponding to ½ of a write voltage (e.g., Vwrite of FIG. 3A) larger than the second voltage Vth2 may be included in the range of the read voltage. This may have an effect upon an adjacent cell in a cross-point structure, as will be described below.

Therefore, in this embodiment of the present invention, the unit cell 10 includes the first structure 100A, the material layer 150, and the second structure 100B that are stacked together. The characteristics of the unit cell 10 in accordance with the embodiment of the present invention will be described with reference to FIG. 3B.

The unit cell 10 may have the states described in Table 1. That is, when the first structure 100A is in the HRS and the second structure 100B is in the LRS, data '0' is stored in the unit cell, when the first structure 100A is in the LRS and the second structure 100B is in the HRS, data '1' is stored in the unit cell, and when both of the first and second structures 100A and 100B are in the LRS, the unit cell is in the 'ON' state.

Referring to FIG. 3B, when data '1' is stored in the unit cell, that is, when the first structure 100A is in the LRS and the second structure 100B is in the HRS, the unit cell maintains the corresponding state during an interval that the voltage applied across the unit cell is increased from 0V in the positive direction, and the second structure 100B is switched to the LRS from the HRS at a point that a first voltage Vth1 is applied across the unit cell. Accordingly, the unit cell is in the 'ON' state. At this time, it may be assumed that when the voltage applied across the material layer 150 ranges from 0 to ±set voltage Vset, the material layer 150 is in the HRS, and when the voltage is equal to or more than ±set voltage Vset, the material layer 150 is in the LRS. In this case, when the voltage is increased from 0V in the positive direction, the voltage applied across the unit cell is applied to the material layer 150 in the HRS as well as the second structure 100B in the HRS. Therefore, the first voltage Vth1 has substantially the same value as or slightly larger than twice the magnitude of the set voltage Vset. That is, the magnitude of the first voltage Vth1 increases compare to the conventional unit cell. At the time point where the voltage reaches the first voltage Vth1, the material layer 150 is switched to the LRS from the HRS.

Subsequently, when the voltage applied across the unit cell is increased from the first voltage Vth1 in the positive direction and reaches a second voltage Vth2, the first structure 100A is switched from the LRS to the HRS, and the unit cell is in a state where data '0' is stored therein. At this time, since the second voltage Vth2 is larger than the first voltage Vth1, the LRS of the material layer 150 is maintained. Therefore, since all of the first and second structures 100A and 100B and the material layer 150 are in the LRS, the second voltage Vth2 has substantially the same value as thrice the magnitude of the reset voltage Vreset.

Subsequently, when the voltage applied across the unit cell is reduced from the second voltage Vth2, the first structure 100A is switched from the HRS to the LRS when the voltage applied across the unit cell reaches a third voltage Vth3, while the unit cell maintains the corresponding state, and the unit cell is in the 'ON' state. However, the material layer 150 is changed to the HRS at a point where the voltage reduced from the second voltage Vth2 becomes lower than the first voltage Vth1. Therefore, the voltage applied across the unit cell is applied to the material layer 150 in the HRS and the first structure 100A in the HRS. Accordingly, the third voltage Vth3 has substantially the same value as or a slightly smaller value than 2×−|set voltage Vset|. At the point where the voltage reaches the third voltage Vth3, the material layer 150 is switched form the HRS to the LRS.

Subsequently, when the voltage applied across the unit cell is reduced from the third voltage Vth3 and reaches a fourth voltage Vth4, the second structure 100B is switched from the LRS to the HRS, and the unit cell is at the state where data '1' is stored therein. At this time, since the fourth voltage Vth4 is smaller than the third voltage Vth3, the LRS of the material layer 150 is maintained. Therefore, since all of the first and second structures 100A and 100B and the material layer 150 are in the LRS, the fourth voltage Vth4 is substantially the same as 3×−|preset voltage Vreset|.

The unit cell in accordance with the embodiment of the present invention is switched to the ON state at the first voltage Vth1, switched to the '0' state at the second voltage Vth2, switched to the ON state at the third voltage Vth3, and switched to the '1' state at the fourth voltage Vth3, like the conventional unit cell. Furthermore, the unit cell maintains the last state in a period between the respective voltages. Compared with the conventional unit cell, however, the first and third voltages Vth1 and Vth3 are increased two times, but the second and fourth voltages Vth2 and Vth4 are increased 1.5 times.

Therefore, when a write voltage larger than the second voltage Vth2 or smaller than the fourth voltage Vth4 is applied and a read voltage between the first and second voltages Vth1 and Vth2 is applied, a value corresponding to ½ of a write voltage (refer to Vwrite of FIG. 3B) larger than the second voltage Vth2 is not included in the range of the read voltage. As a result, this does not have an effect upon an adjacent cell in the cross-point structure as will be described below.

Figure 4A:
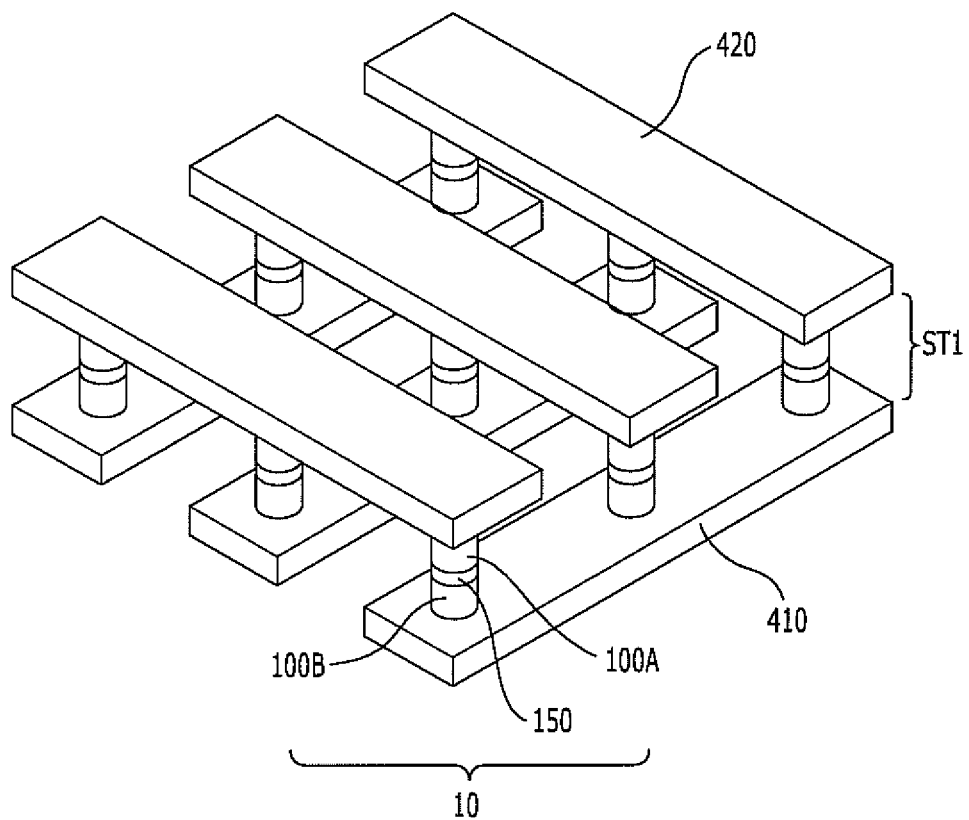
FIG. 4A is a perspective view of a cross-point structure including the unit cell 10 of FIG. 1.
Figure 4B:
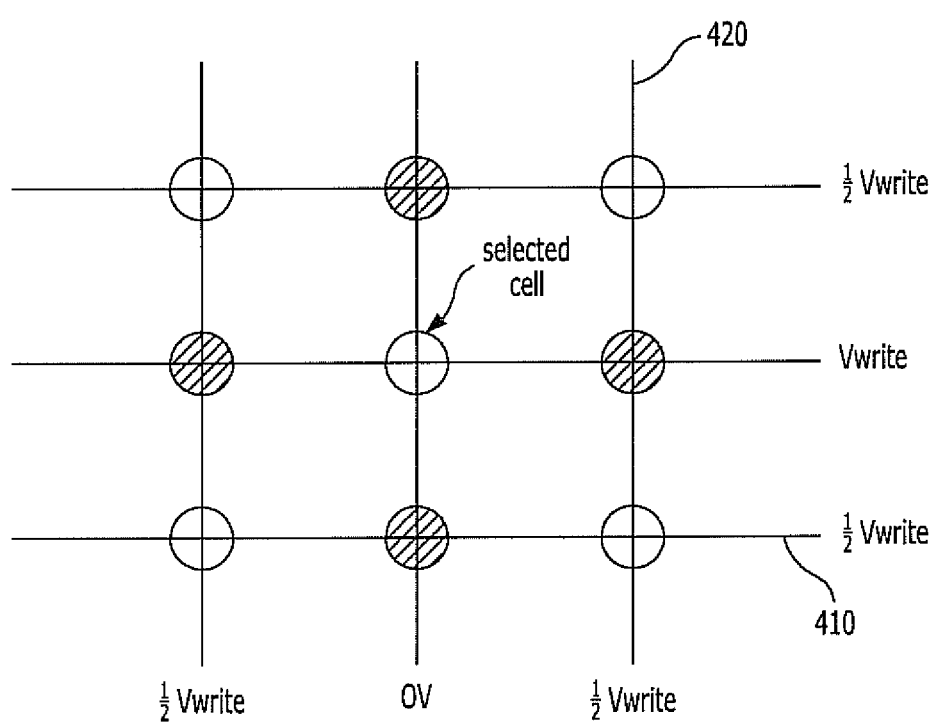
FIG. 4B is a planar view of FIG. 4A, simply showing applied voltages.

FIG. 4A is a perspective view of a cross-point structure including the unit cell 10 of FIG. 1, and FIG. 4B is a planar view of FIG. 4A, simply showing applied voltages.

Referring to FIG. 4A, a plurality of first conductive lines 410 parallel to each other and a plurality of second conductive lines 420, which are arranged over the first conductive lines 410 and parallel to each other while crossing the first conductive lines 410, are arranged, and a plurality of unit cells 10 are arranged at the respective intersections between the first conductive lines 410 and the second conductive lines 420. Although not illustrated in FIG. 4A, the second electrodes 130A and 130B of each unit cell 10 may be omitted, and the first and second conductive lines 410 and 420 may serve as the second electrodes 130A and 130B, respectively.

During a write operation for a selected cell in such a cross-point structure, a write voltage Vwrite and 0V are applied to the first and second conductive lines 410 and 420 coupled to the selected cell, respectively, and ½ Vwrite is applied to the other first and second conductive lines 410 and 420 which are not coupled to the selected cell. Accordingly, 0V is applied across cells coupled to the first and second conductive lines 410 and 420 which are not coupled to the selected cell. At this time, −½ Vwrite or ½ Vwrite is applied to unselected cells (indicated by oblique lines) which are coupled to the first and second conductive lines 410 and 420 coupled to the selected line.

In the conventional unit cell, when it is assumed that the absolute values of the set voltage Vset and the reset voltage Vreset are set to about 1V, Vwrite is slightly larger than 2V. Accordingly, since ½ Vwrite is larger than 1V, ½ Vwrite is included in the read voltage range of 1V to 2V. Therefore, a read operation for the unselected cells coupled to the first and second conductive lines 410 and 420 coupled to the selected cell changes data stored in the unselected cells.

In the exemplary embodiment of the present invention, however, when it is assumed that the absolute values of the set voltage Vset and the reset voltage Vreset are set to about 1V, Vwrite is slightly larger than 3V. Accordingly, since ½ Vwrite corresponds to about 1.5V, ½ Vwrite is not included in the read voltage range of 2V to 3V. Therefore, ½ Vwrite has no effect upon the unselected cells coupled to the first and second conductive lines 410 and 420 coupled to the selected cell.

As a result, when the unit cell 10 in accordance with the exemplary embodiment of the present invention is used to implement the cross-point structure, the unit cell 10 stays in the HRS except for during the read operation. Therefore, leakage current does not occur, and the power consumption is reduced.

Meanwhile, FIG. 4A illustrates the variable resistance memory device having one stack ST1 according to an exemplary embodiment. However, according to an example, the variable resistance memory device may include a multi-stack structure in which two or more stacks are vertically stacked. In such a multi-stack structure, a second stack (not illustrated) over the first stack ST1 may share the second conductive lines 420.

Figure 6:
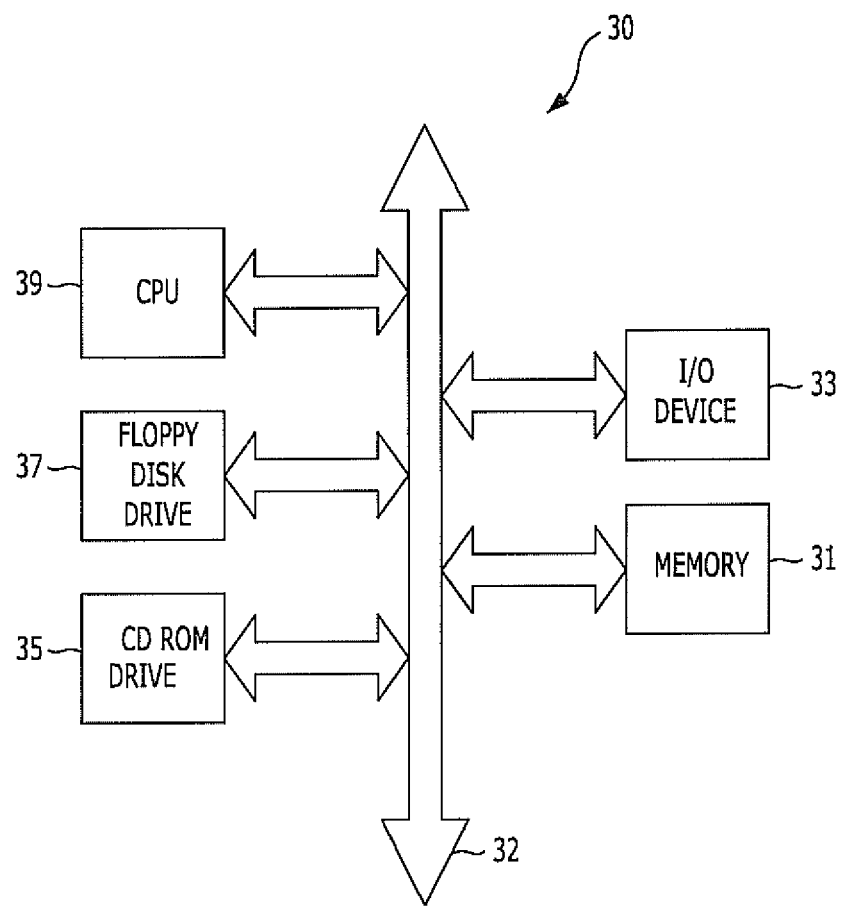
FIG. 6 illustrates a processor system in accordance with an embodiment of the present invention.

FIG. 6 illustrates a processor system in accordance with an embodiment of the present invention.

The processor system 30 includes a memory 31 having a plurality of unit cells illustrated in FIG. 1 or the cross-point structure of FIG. 4A. Furthermore, the processor system 30 may further include various components required for processing, for example, a CPU 39, a floppy disk driver 37, a CD ROM drive 35, an I/O device and so on.

The memory 31 may communicate with the CPU 39 through a bus 32. In addition, the floppy disk drive 37, the CD ROM drive 35, the I/O device 33 and other components may communicate with the CPU 39 through the bus 32.

In accordance with the embodiment of the present invention, the variable resistance memory device may increase an integration degree because it may be implemented with a cross-point structure, reduce leakage current and power consumption, and improve a write operation characteristic.

While the present invention has been described with respect to the specific embodiments, it will be apparent to those skilled in the art that various changes and modifications may be made without departing from the spirit and scope of the invention as defined in the following claims.

What is claimed is:

1. A variable resistance memory device comprising:
   first and second structures that each comprise a first electrode, a second electrode, and a variable resistance material layer interposed between the first and second electrodes and configured to switch between different resistance states depending on a voltage applied across the variable resistance material layer; and
   a material layer interposed between the first and second structures and configured to pass a bidirectional current according to a voltage applied across the material layer, wherein the first and second structures are symmetrical with respect to the material layer.

2. The variable resistance memory device of claim 1, wherein as an absolute value of the voltage applied across the material layer increases, the magnitude of the bidirectional current increases, and
   when the absolute value of the voltage applied across the material layer is equal to or more than a first value, the rate of the increase in magnitude of the bidirectional current becomes larger than when the absolute value of the voltage is less than the first value.

3. The variable resistance memory device of claim 1, wherein a set voltage applied during a set operation and a reset voltage applied during a reset operation in each of the first and second structures have different polarities but substantially the same absolute value.

4. The variable resistance memory device of claim 3, wherein as an absolute value of the voltage applied across the material layer increases, the magnitude of the bidirectional current increases, and
   when the absolute value of the voltage applied across the material layer is equal to or more than the absolute value of the set voltage, the rate of the increase in magnitude of the bidirectional current becomes larger than when the absolute value of the voltage is less than the absolute value of the set voltage.

5. The variable resistance memory device of claim 4, wherein when a first voltage having substantially the same magnitude as the double of the absolute value of the set voltage is applied across the variable resistance memory device in a first data storage state, the first data storage state is configured to be switched to an ON state,
   when a second voltage having substantially the same magnitude as thrice the absolute value of the reset voltage is applied across the variable resistance memory device in the ON state, the ON state is switched to a second data storage state,
   when a negative third voltage having substantially the same magnitude as twice the absolute value of the set voltage is applied across the variable resistance memory device in the second data storage state, the second data storage state is switched to the ON state, and when a negative fourth voltage having substantially the same magnitude as thrice the absolute value of the reset voltage is applied across the variable resistance memory device in the ON state, the ON state is switched to the first data storage state.

6. The variable resistance memory device of claim 1, wherein the first and second electrodes comprise TiN, the variable resistance material layer comprises a stacked structure of $TiO_2$ and Ti, and the material layer comprises $TiO_2$.

7. A variable resistance memory device comprising:

a plurality of first conductive lines;

a plurality of second conductive lines crossing the first conductive lines; and a plurality of cells arranged at intersections between the first conductive lines and the second conductive lines, wherein each of the cells comprises:

a material layer configured to pass a bidirectional current according to a voltage applied across the material layer; and first and second structures that each comprise a first electrode and a variable resistance material layer, wherein the first and second structures are formed symmetrically with respect to the material layer.

8. The variable resistance memory device of claim 7, wherein the first and second structures further comprise second electrodes interposed between the first conductive lines and the variable resistance material layer and between the second conductive lines and the variable resistance material layer, respectively.

9. The variable resistance memory device of claim 7, wherein as an absolute value of the voltage applied across the material layer increases, the magnitude of the bidirectional current increases, and when the absolute value of the voltage applied across the material layer is equal to or more than a first value, the rate of the increase in magnitude of the bidirectional current becomes larger than when the absolute value of the voltage is less than the first value.

10. The variable resistance memory device of claim 7, wherein a set voltage applied during a set operation and a reset voltage applied during a reset operation in each of the first and second structures have different polarities and substantially the same absolute value.

11. The variable resistance memory device of claim 10, wherein as an absolute value of the voltage applied across the material layer increases, the magnitude of the bidirectional current increases, and when the absolute value of the voltage applied across the material layer is equal to or more than the absolute value of the set voltage, the rate of the increase in magnitude of the bidirectional current becomes larger than when the absolute value of the voltage is less than the absolute value of the set voltage.

12. The variable resistance memory device of claim 11, wherein when a first voltage having substantially the same magnitude as twice the absolute value of the set voltage is applied across the cell in a first data storage state, the first data storage state is switched to an ON state, when a second voltage having substantially the same magnitude as thrice the absolute value of the reset voltage is applied across the cell in the ON state, the ON state is switched to a second data storage state, when a negative third voltage having substantially the same magnitude as twice the absolute value of the set voltage is applied across the cell in the second data storage state, the second data storage state is switched to the ON state, and when a negative fourth voltage having substantially the same magnitude as thrice the absolute value of the reset voltage is applied across the cell in the ON state, the ON state is switched to the first data storage state.

13. The variable resistance memory device of claim 12, wherein a write voltage applied to the first and second conductive lines coupled to a selected cell is larger than the second voltage or smaller than the fourth voltage, and ½ of the write voltage is applied to an unselected cell sharing the first or second conductive line with the selected cell and is smaller than the first voltage or larger than the third voltage.

14. The variable resistance memory device of claim 7, wherein the first electrode comprises TiN, the variable resistance material layer comprises a stacked structure of $TiO_2$ and Ti, and the material layer comprises $TiO_2$.

* * * * *